United States Patent
Cheng et al.

(10) Patent No.: US 9,269,627 B1
(45) Date of Patent: Feb. 23, 2016

(54) FIN CUT ON SIT LEVEL

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/501,654

(22) Filed: Sep. 30, 2014

(51) Int. Cl.
| | |
|---|---|
| H01L 21/311 | (2006.01) |
| H01L 21/8234 | (2006.01) |
| H01L 27/088 | (2006.01) |
| H01L 29/66 | (2006.01) |
| H01L 21/02 | (2006.01) |
| H01L 21/027 | (2006.01) |
| H01L 21/306 | (2006.01) |

(52) U.S. Cl.
CPC .... *H01L 21/823431* (2013.01); *H01L 21/0217* (2013.01); *H01L 21/0274* (2013.01); *H01L 21/02164* (2013.01); *H01L 21/02271* (2013.01); *H01L 21/02532* (2013.01); *H01L 21/30604* (2013.01); *H01L 27/0886* (2013.01); *H01L 29/6656* (2013.01)

(58) Field of Classification Search
USPC .......................................... 438/703, 696, 424
See application file for complete search history.

(56) References Cited

U.S. PATENT DOCUMENTS

| | | | |
|---|---|---|---|
| 7,301,210 | B2 | 11/2007 | Abadeer et al. |
| 7,763,531 | B2 | 7/2010 | Abadeer et al. |
| 8,105,901 | B2 | 1/2012 | Cheng et al. |
| 8,557,675 | B2 | 10/2013 | LiCausi |
| 2007/0170521 | A1 | 7/2007 | Abadeer et al. |
| 2007/0284669 | A1 | 12/2007 | Abadeer et al. |
| 2007/0292996 | A1 | 12/2007 | Abadeer et al. |
| 2009/0124097 | A1 | 5/2009 | Cheng |
| 2013/0001750 | A1 | 1/2013 | Arnold et al. |
| 2014/0110817 | A1 | 4/2014 | Bergendahl et al. |
| 2014/0191330 | A1 | 7/2014 | Cheng et al. |

*Primary Examiner* — Timor Karimy
(74) *Attorney, Agent, or Firm* — Scully, Scott, Murphy & Presser, P.C.; Daniel P. Morris, Esq.

(57) ABSTRACT

A method of forming semiconductor fins with variable pitches of arbitrary values in a sidewall image transfer (SIT) process is provided. After forming an array of first mandrel structures with a constant pitch and removing at least one first mandrel structure form the array, a set of second mandrel structures are formed overlapping the first mandrel structures. The combination of the first mandrel structures and the second mandrel structures defines pitches of sidewall spacer patterns to be subsequently formed.

17 Claims, 16 Drawing Sheets

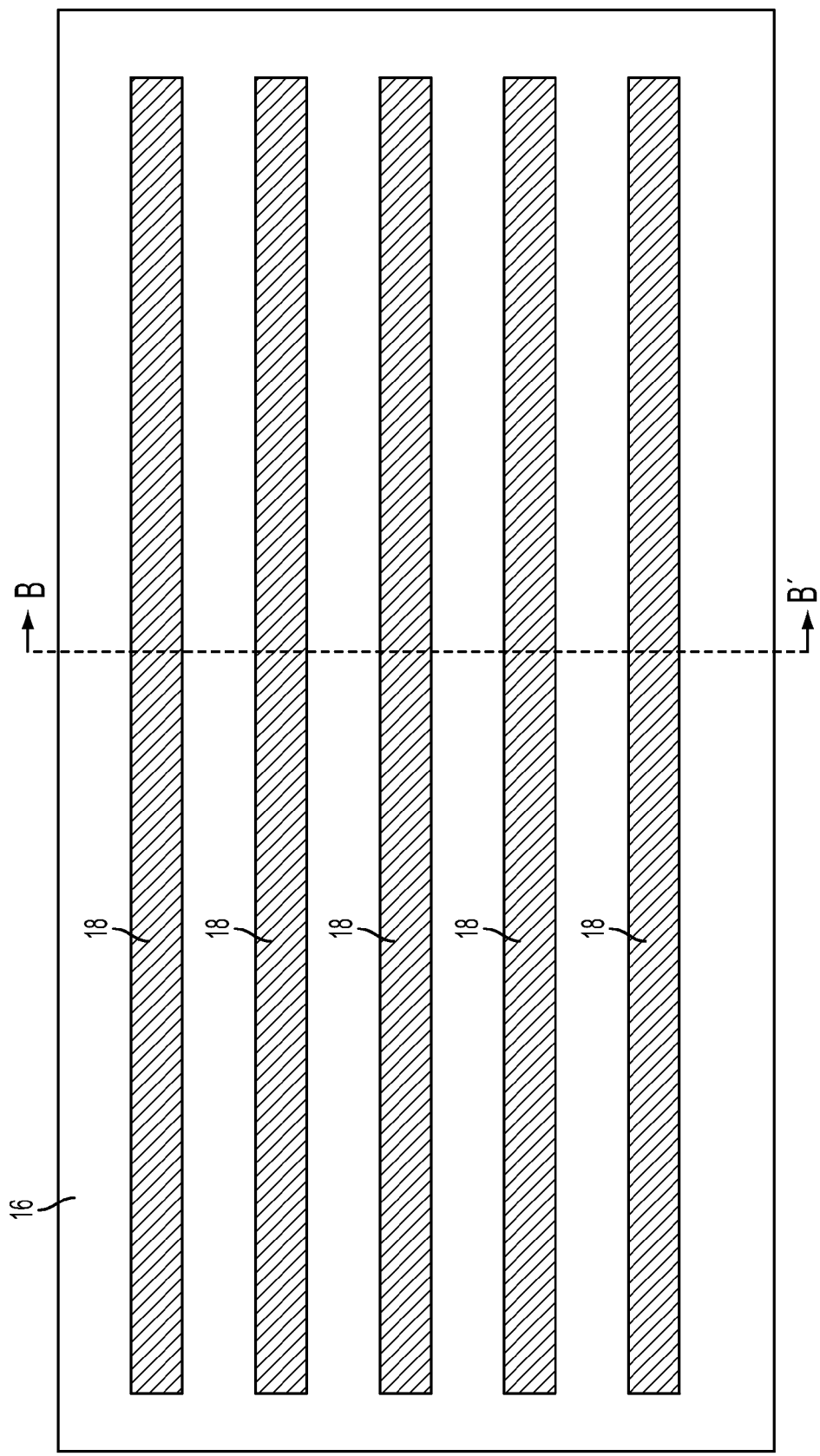

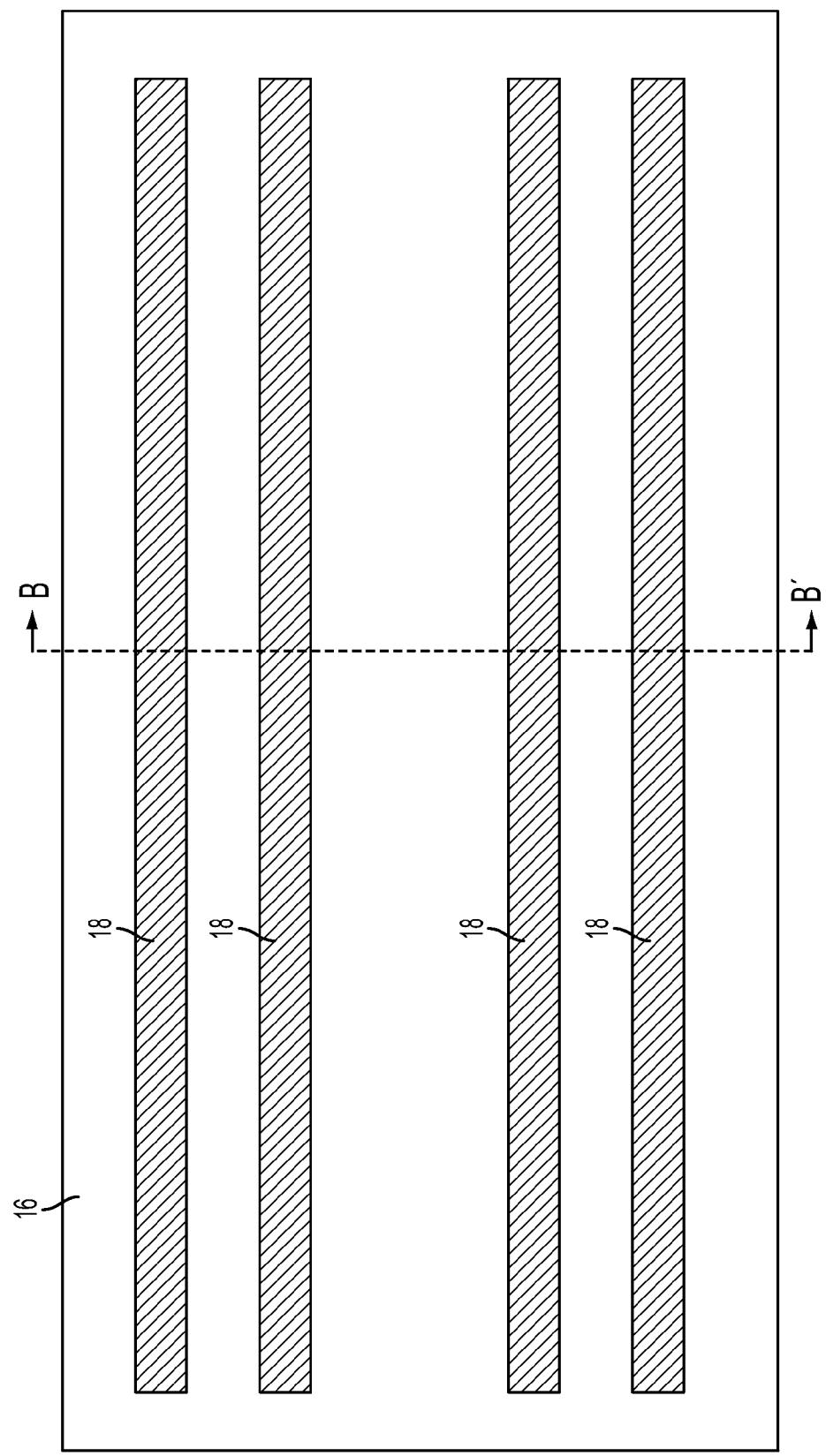

FIN CUT ON SIT LEVEL

BACKGROUND

The present application relates to semiconductor device fabrication. More particularly, the present application relates to formation of semiconductor fins with variable fin pitches by using a combination of two sets of mandrel structures in a sidewall image transfer (SIT) process.

As integrated circuits continue to scale downward in size, fin field effect transistors (FinFETs) are becoming increasingly attractive to be used in smaller nodes, e.g., the 22 nm node and beyond. FinFETs can achieve higher drive currents with increasingly smaller dimensions as compared to conventional planar FETs. In order to meet the density targets of advanced nodes, semiconductor fins are typically formed utilizing a sidewall image transfer (SIT) process since the same provides sub-lithographic line widths (i.e., less than 40 nm). In a typical SIT process, spacers are formed on each sidewall of a mandrel structure that is formed on a topmost semiconductor material of a substrate. The mandrel structure is removed and the remaining spacers are used as an etch mask to etch the topmost semiconductor material of the substrate. The spacers are then removed after each semiconductor fin has been formed.

One problem that is associated with forming semiconductor fins at tight pitch is that the process window for cutting of unwanted semiconductor fins is quite narrow. More specifically, the space available between fins at a tight pitch decreases the process window for placement of a fin cut mask edge in between fins. As the pitch of the semiconductor fins decreases, it becomes difficult to remove unwanted semiconductor fins without adversely affecting adjacent device fins due to the process variation and small process margin of lithographic processes. Also, integrated circuits typically contain areas having different device density, which requires forming semiconductors fins with regular and irregular spacing. As such, a method is needed that is capable of forming semiconductor fins in which the process window for cutting unwanted semiconductor fins is improved.

SUMMARY

The present application provides a method of forming semiconductor fins with variable pitches of arbitrary values in a sidewall image transfer (SIT) process. After forming an array of first mandrel structures with a constant pitch and removing at least one first mandrel structure form the array, a set of second mandrel structures are formed overlapping the first mandrel structures. The combination of the first mandrel structures and the second mandrel structures defines pitches of sidewall spacer patterns to be subsequently formed.

In one aspect of the present application, a method of forming a semiconductor structure is provided. The method includes first forming a set of first mandrel structures on a substrate. After removing at least one first mandrel structure from the set of first mandrel structures, a set of second mandrel structures are formed over remaining first mandrel structures and portions of the substrate. Each second mandrel structure overlaps at least a portion of at least one first mandrel structure of the remaining first mandrel structures and fills at least a portion of at least one space between adjacent first mandrel structures of the remaining first mandrel structures. Next, first spacer portions are formed on exposed sidewalls of the remaining first mandrel structures and second spacer portions are formed on exposed sidewalls of the second mandrel structures. After removing the remaining first mandrel structures and the second mandrel structures selective to the first spacer portions and the second spacer portions, a pattern of the first spacer portions and the second spacer portions is transferred into a portion of the substrate.

In another aspect of the present application, a semiconductor structure is provided. The semiconductor structure includes a plurality of semiconductor fins located on a substrate. A first sub-set of the plurality of semiconductor fins have a first pitch equal to a sum of a width of each of the plurality of semiconductor fins and a spacing between two closest adjacent semiconductor fins in the plurality of semiconductor fins. A second sub-set of the plurality of semiconductor fins have a second pitch equal to n times the first pitch. n is an integer greater than one. A third sub-set of the plurality of semiconductor fins have a third pitch greater than a first pitch, wherein the third pitch does not equal to an integer multiplication of the first pitch.

BRIEF DESCRIPTION OF SEVERAL VIEWS OF THE DRAWINGS

FIG. 1A is a top-down view of an exemplary semiconductor structure including a set (i.e., array) of first mandrel structures located on a surface of a substrate in accordance with an embodiment of the present application.

FIG. 2A is a top-down view of the exemplary semiconductor structure of FIG. 1A after removing one of the first mandrel structures from the array of first mandrel structures.

DETAILED DESCRIPTION

Figure 1B:
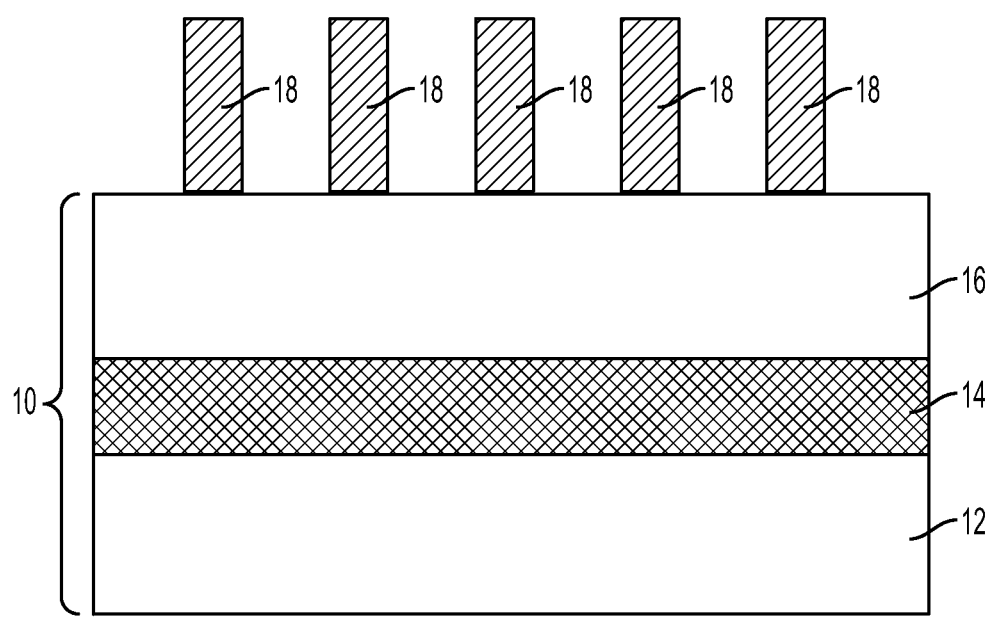
FIG. 1B is a cross-sectional view of the exemplary semiconductor structure of FIG. 1A along line B-B'.

The present application will now be described in greater detail by referring to the following discussion and drawings that accompany the present disclosure. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Although the following description and drawings of the present application disclose utilizing the methods of the present application for forming semiconductor fins, the present application is not limited to only the formation of semiconductor Fins. Instead, the present application can be used in forming other types of structures.

Referring first to FIGS. 1A-1B, there is illustrated an exemplary semiconductor structure comprising a set (i.e., array) of first mandrel structures 18 located on a surface of a substrate 10 in accordance with an embodiment of the present application.

In one embodiment of the present application and as illustrated in the drawings of the present application, the substrate 10 is a semiconductor-on-insulator (SOI) substrate that includes, from bottom to top, a handle substrate 12, an insulator layer 14 and a top semiconductor layer 16. In some embodiments, the handle substrate 12 is optional and can be omitted. In another embodiment of the present application, the substrate 10 can be comprised of a bulk semiconductor substrate. By "bulk semiconductor substrate" it is meant a semiconductor material that is comprised entirely of a semiconductor material. For example, the substrate 10 shown in FIG. 1 would consist entirely of the top semiconductor layer 16.

When present, the handle substrate 12 can include a semiconductor material, a conductive material, and/or a dielectric material. The handle substrate 12 can provide mechanical support to the insulator layer 14, and the top semiconductor layer 16 of an SOI substrate. The thickness of the handle substrate 12 can be from 30 microns to 2 mm, although lesser and greater thicknesses can also be employed.

When present, the insulator layer 14 may be a crystalline, or non-crystalline, oxide or nitride. In one embodiment, the insulator layer 14 is an oxide such as, for example, silicon oxide. The insulator layer 14 may be a single continuous layer that spans the entirety of the handle substrate 12 or it may be discontinuous. When a discontinuous insulator region is present, the insulator region exists as an isolated island that is surrounded by semiconductor material. The thickness of the insulator layer 14 can be from 50 nm to 5 microns, although lesser and greater thicknesses can also be employed.

The top semiconductor layer 16 (or the bulk semiconductor substrate) can include a single crystalline semiconductor material or a polycrystalline material. In one embodiment, the top semiconductor layer 16 (or the bulk semiconductor substrate) can include an elemental semiconductor material such as Si or Ge, a semiconductor material primarily composed of Group IV elements such as a silicon-germanium alloy or a silicon-carbon alloy, a III-V compound semiconductor material, a II-VI compound semiconductor material, or an organic semiconductor material. In one embodiment, the top semiconductor layer 16 (or the bulk semiconductor substrate) can include a single crystalline elemental semiconductor material, a single crystalline semiconductor material primarily composed of Group IV elements, a single crystalline III-V compound semiconductor material, a single crystalline II-VI compound semiconductor material, or a single crystalline organic semiconductor material. In another embodiment, the top semiconductor layer 16 (or the bulk semiconductor substrate) can consist essentially of undoped single crystalline silicon or single crystalline silicon doped with p-type dopant atoms or n-type dopant atoms.

The first mandrel structures 18 can include any material (semiconductor, dielectric or conductive) that can be selectively removed from the structure during a subsequently performed etching process. In one embodiment, the first mandrel structures 18 may be composed of amorphous silicon, polysilicon, amorphous or polycrystalline germanium, an amorphous or polycrystalline silicon-germanium alloy material, amorphous carbon, diamond-like carbon, or organosilicate glass. In another embodiment, the first mandrel structures 18 may be composed of a metal such as, for example, Al, W, or Cu.

The first mandrel structures 18 can be formed by first depositing a blanket layer of a first mandrel material on the entire topmost surface of substrate 10 (not shown). The first mandrel material layer can be formed, for example, by chemical vapor deposition (CVD) or plasma enhanced chemical vapor deposition (PECVD). The thickness of the first mandrel material layer can be from 50 nm to 300 nm, although lesser and greater thicknesses can also be employed. Following deposition of the first mandrel material layer, the first mandrel material layer can be patterned by lithography and etching. The patterning of the first mandrel material layer can be performed, for example, by applying a photoresist layer (not shown) above the first mandrel material layer, lithographically patterning the photoresist layer to define a set of areas covered by the patterned photoresist layer, and transferring the pattern in the photoresist layer into the first mandrel material layer by an anisotropic etch. The anisotropic etch can be selective to the semiconductor material of the top semiconductor layer 16 of the substrate 10. The patterned portions of the first mandrel material layer constitute the first mandrel structures 18.

Each first mandrel structure 18 that is formed may have a rectangular shape in cross-section with a constant width. The width of each first mandrel structure 18 is about the same as that for fin spacing. In one embodiment, the width of each first mandrel structure 18 is from 10 nm to 50 nm, although lesser and greater widths can also be employed. The height of each first mandrel structure 18 that is formed is from 50 nm to 300 nm, although lesser and greater heights can also be employed. In the embodiment that is illustrated in FIG. 1A, the first mandrel structures 18 are arranged parallel to each other to form an array of periodic patterns that is repeated along a direction (i.e., widthwise direction) perpendicular to an elongated direction (i.e., lengthwise direction) of each first mandrel structure 18. The pitch (i.e., the distance between identical points in two adjacent features) the first mandrel structures 18 is specified by the technology node, which defines the smallest feature size achievable. In one embodiment, the first mandrel structures 18 can have a pitch from 50 nm to 200 nm, although lesser and greater pitches can also be employed. Though the first mandrel structures 18 as shown in FIGS. 1A-1B have a constant pitch, in some embodiments of the present application, the first mandrel structures 18 may have a non-constant pitch.

Optionally, a pad layer which may be comprised of silicon nitride or a bilayer comprised of a silicon nitride layer and an underlying silicon oxide layer can be deposited on the top semiconductor layer 16 before the deposition of the mandrel layer. The pad layer, when present, protects the top semiconductor layer 16 during the subsequent patterning processes.

Figure 2B:
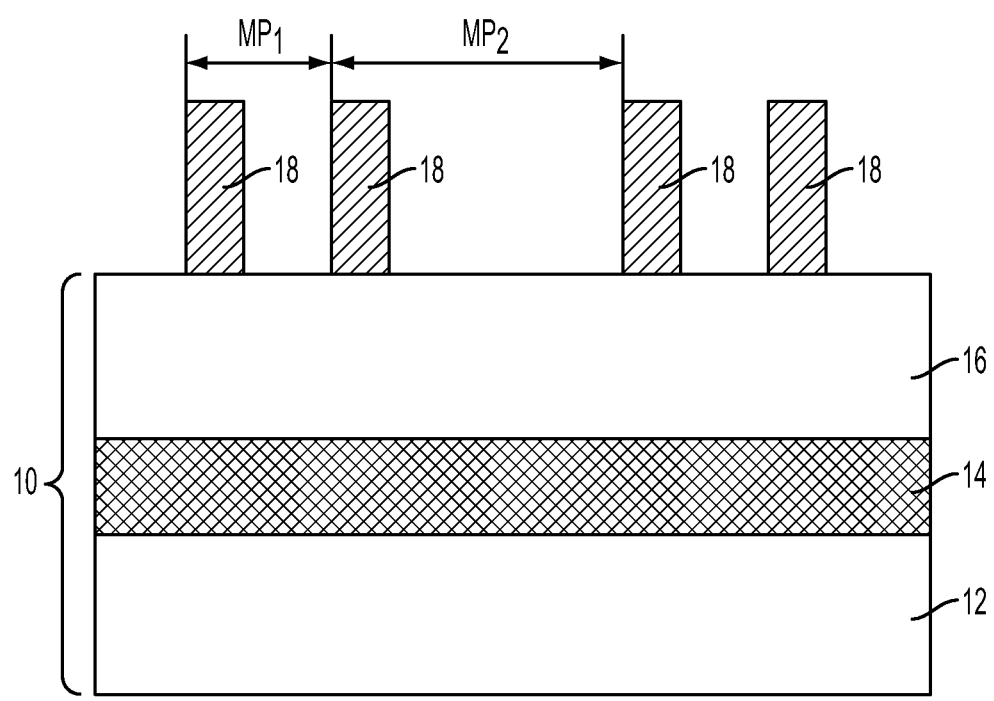
FIG. 2B is a cross-sectional view of the exemplary semiconductor structure of FIG. 2A along line B-B'.

Referring now to FIGS. 2A-2B, there is illustrated the exemplary semiconductor structure of FIGS. 1A-1B after removing one first mandrel structure 18 from the first mandrel structure array using, for example, lithographic patterning followed by an etch which can be an anisotropic etch. Though the illustrated embodiment shows the removal of only one first mandrel structure 18, any number of first mandrel structures 18 may be removed according to design specifications. Removal of the first mandrel structure 18 provides a set of first mandrel structures 18 having two pitches, i.e., the first pitch $MP_1$ and the second pitch $MP_2$, in which the second pitch $MP_2$ is two times the first pitch $MP_1$.

Figure 3A:
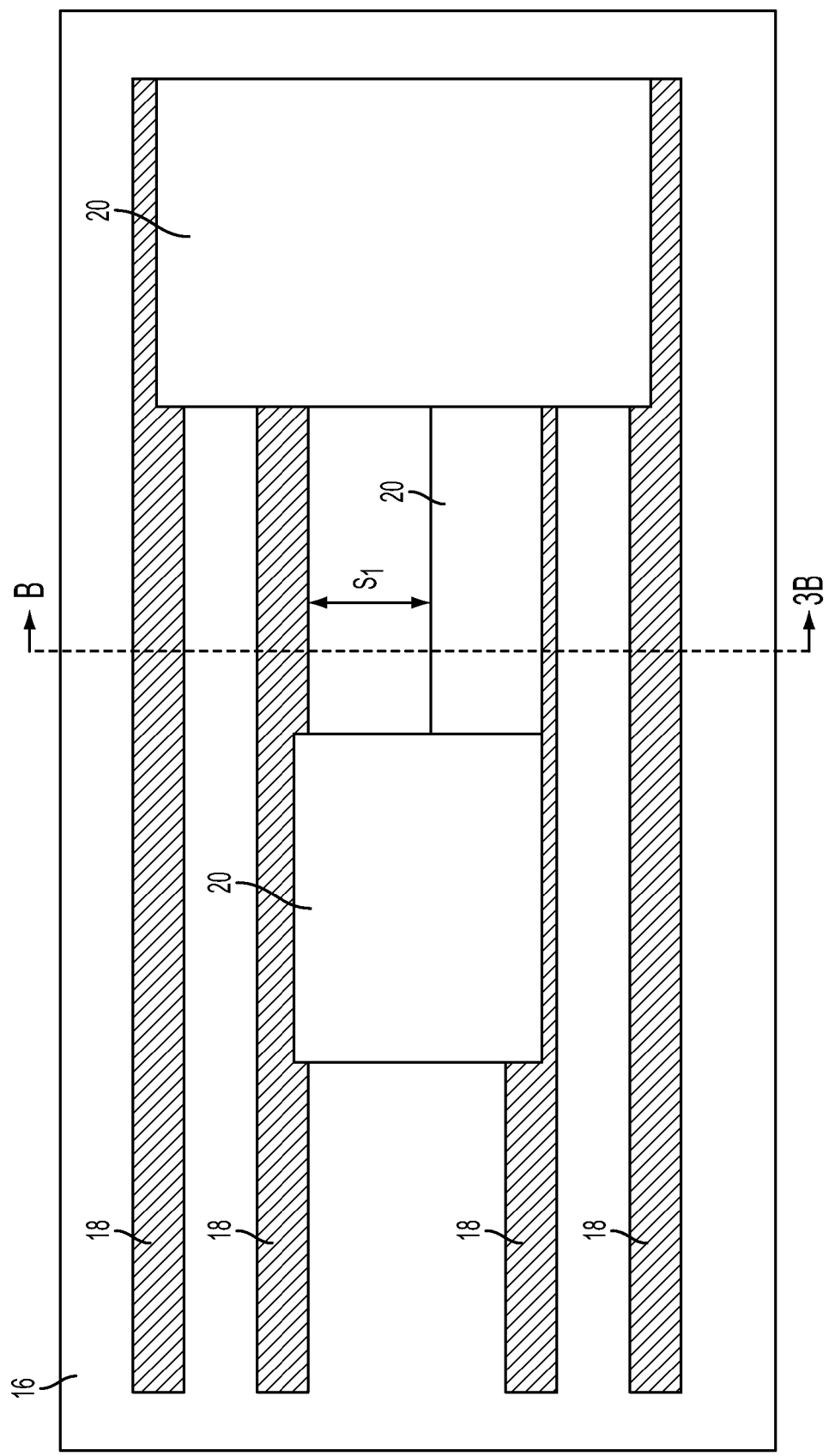
FIG. 3A is a top-down view of the exemplary semiconductor structure of FIG. 2A after forming a set of second mandrel structures on the surface of the substrate, and overlying portions of the first mandrel structures.
Figure 3B:
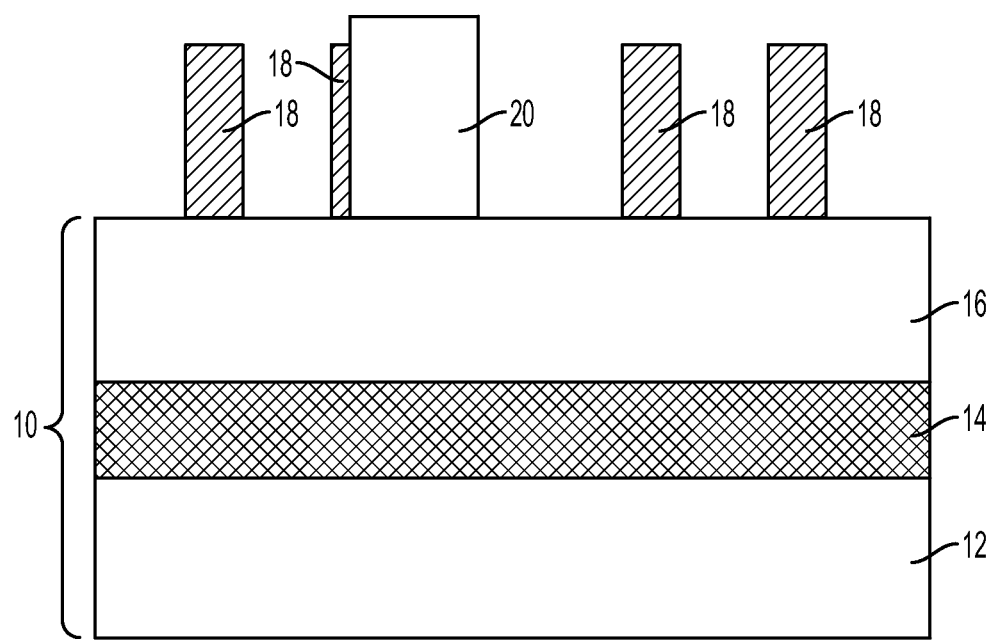
FIG. 3B is a cross-sectional view of the exemplary semiconductor structure of FIG. 3A along line B-B'.

Referring now to FIGS. 3A-3B, there is illustrated the exemplary semiconductor structure of FIGS. 2A-2B after forming a set of second mandrel structures 20 on the surface of the substrate 10, and overlying portions of the first mandrel structures 18. The second mandrel structures 20 overlap with the first mandrel structures 18 such that portions of the first mandrel structures 18 are covered with the second mandrel structures 20. The combination of the first mandrel structures 18 and the second mandrel structures 20 will be employed to define spacing of sidewall spacer patterns to be subsequently formed. These sidewall spacers, after being further processed, will in turn be employed as an etch mask for sublithographic features (e.g., semiconductor fins) to be formed in top semiconductor layer 16 of the substrate 10. Using a combination of two sets of lithographically patterned mandrels in conjunction with sidewall spacers allows the formation of semiconductor fins with pitches of arbitrary values, therefore providing flexibility in circuit design.

In one embodiment and as shown in FIG. 3A, each second mandrel structure 20 has a rectangular shaped cross-section and fills at least a portion of each space between adjacent first mandrel structures 18. Sizes of second mandrel structures 20 can be used to obtain sidewall spacer patterns with spacing of arbitrary values. For example, spacing $S_1$ between the middle second mandrel structure 20 and an adjacent first mandrel structure 18 is determined by the width of the middle second mandrel structure 20 and can be varied by varying the width of the middle second mandrel structure 20.

The second mandrel structures 20 can include a semiconductor material, a dielectric material or a conductive material, provided that the material of the second mandrel structures 20 is different from the material of the first mandrel structure 18 so that the second mandrel structures 20 can be selectively removed with respect to the first mandrel structures 18. In one embodiment, the second mandrel structures 20 may be composed of amorphous silicon, polysilicon, amorphous or polycrystalline germanium, an amorphous or polycrystalline silicon-germanium alloy material, amorphous carbon, diamond-like carbon, organosilicate glass, or a metal such as, for example, Al, W, or Cu. In one embodiment and when each first mandrel structure 18 includes silicon, each second mandrel structure 20 may include silicon germanium.

The second mandrel structures 20 can be formed by first depositing a blanket layer of a second mandrel material over the first mandrel structures 18 and exposed surfaces of the topmost surface of substrate 10 (not shown). In one embodiment, the second mandrel material layer completely fills spaces between adjacent first mandrel structures 18. The second mandrel material layer can be formed, for example, by CVD or PECVD. The thickness of the second mandrel material layer can be from 55 nm to 500 nm, although lesser and greater thicknesses can also be employed. Following deposition of the second mandrel material layer, the second mandrel material layer can be patterned by lithography and etching. The patterning of the second mandrel material layer can be performed, for example, by applying a photoresist layer (not shown) above the second mandrel material layer, lithographically patterning the photoresist layer to define a set of areas covered by the patterned photoresist layer, and transferring the pattern in the photoresist layer into the second mandrel material layer by an anisotropic etch. The anisotropic etch can be selective to the materials of the first mandrel structures 18 and the top semiconductor layer 16 of the substrate 10. The patterned portions of the second mandrel material layer constitute the second mandrel structures 20.

Figure 4A:
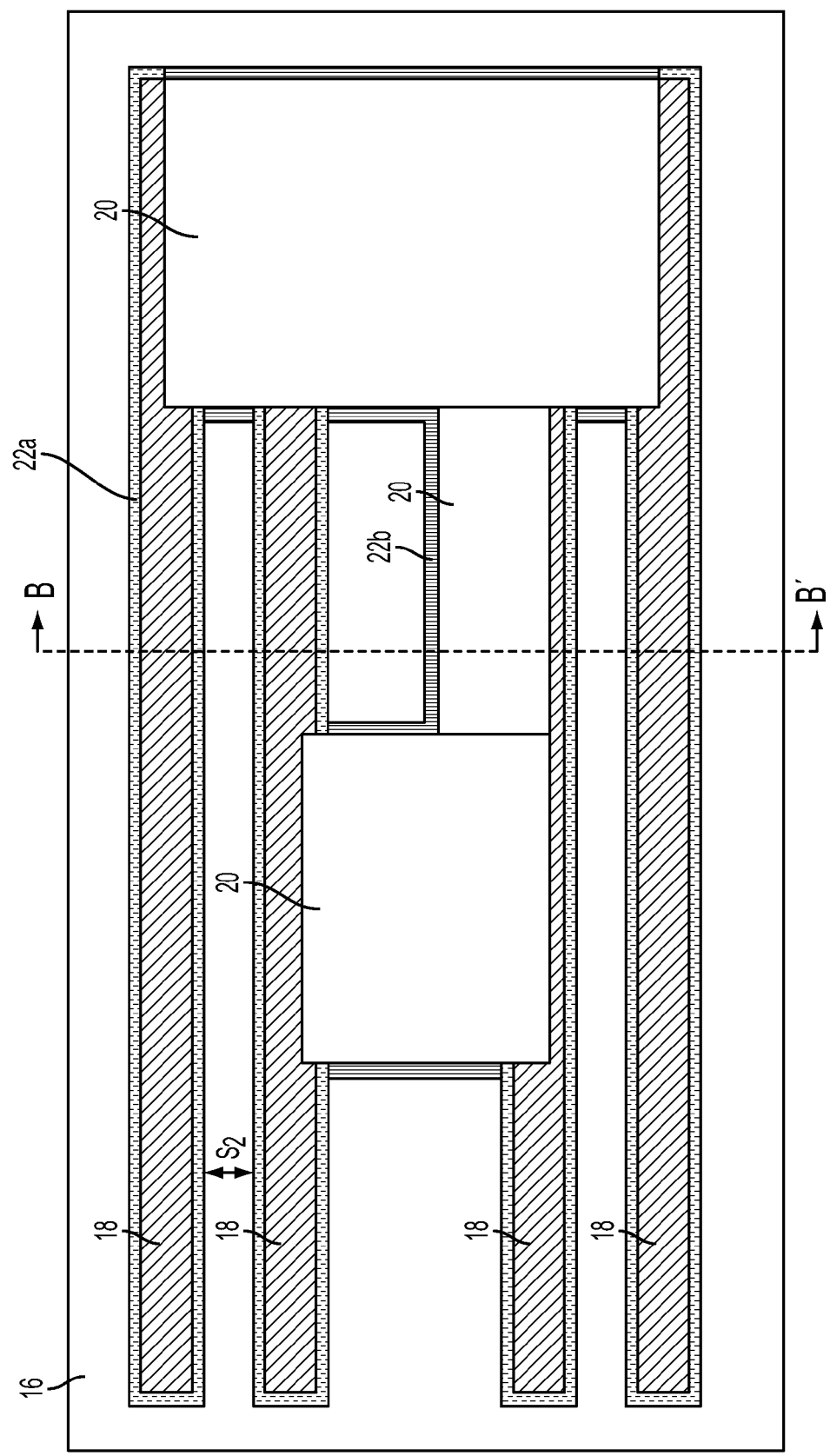
FIG. 4A is a top-down view of the exemplary semiconductor structure of FIG. 3A after forming a first pacer portion on each exposed sidewall of the first mandrel structures and a second spacer portion on each exposed sidewall of the second mandrel structures.
Figure 4B:
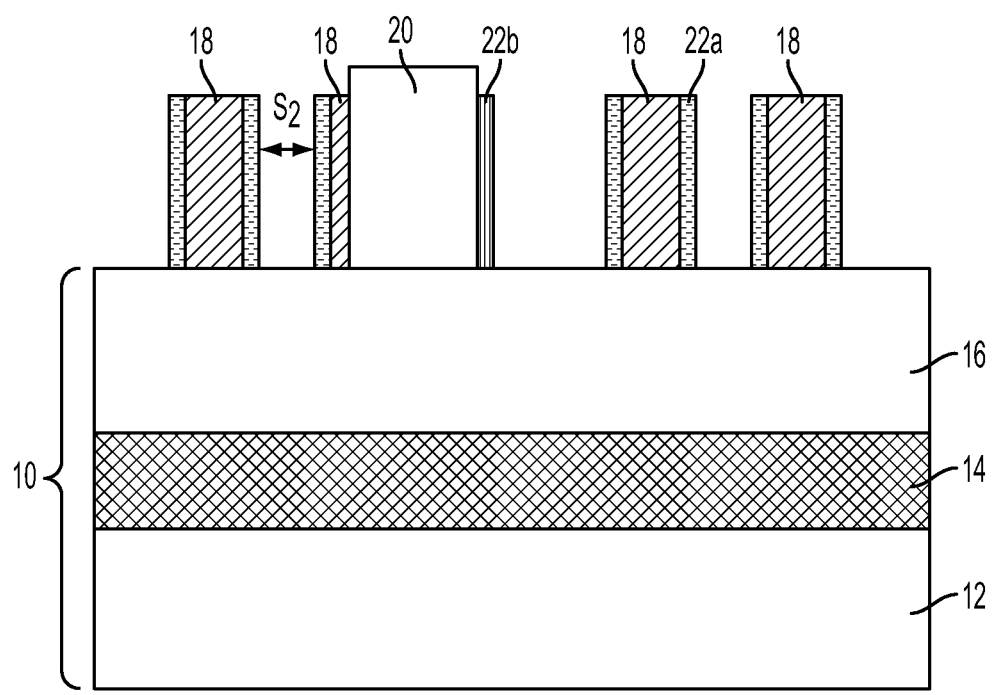
FIG. 4B is a cross-sectional view of the exemplary semiconductor structure of FIG. 4A along line B-B'.

Referring now to FIGS. 4A-4B, there is illustrated the exemplary semiconductor structure of FIGS. 3A-3B after forming a first spacer portion 22a on each exposed sidewall of the first mandrel structures 18 and a second spacer portion 22b on each exposed sidewall of the second mandrel structures 20. The first spacer portions 22a and the second portions 22b that are employed in the present application may comprise any material that has a different etching characteristics from the material of the first mandrel structures 18 and the material of the second mandrel structures 20, so that the first mandrel structures 18 and the second mandrel structures 20 and can be selectively removed with respect to the first spacer portions 22 and the second spacer portions 22b.

In some embodiments of the present application, the first spacer portions 22a and the second spacer portions 22b may include a dielectric material. In one embodiment, the dielectric material that is used in providing the first spacer portions 22a and the second spacer portions 22b may include a nitride such as silicon nitride or an oxide such as silicon dioxide. In another embodiment of the present application, the dielectric material that is used in providing the first spacer portions 22a and the second spacer portions 22b may be a dielectric material having a dielectric constant of less than silicon dioxide (such dielectric materials may be referred to herein as low k). Examples of dielectric materials having a low dielectric constant include, but are not limited to, silsesquioxanes, C-doped oxides (i.e., organic silicates) that include atoms of Si, C, O and H, and thermosetting polyarylene ethers. The term "polyarylene" is used throughout the present application to denote aryl moieties or inertly substituted aryl moieties which are linked together by bonds, fused rings, or inert linking groups such as, for example, oxygen, sulfur, sulfone, sulfoxide, carbonyl and the like. In yet another embodiment of the present application, the dielectric material that is used in providing the first spacer portions 22a and the second spacer portions 22b may be a dielectric material having a dielectric constant that is equal to or even greater than that of silicon dioxide (such dielectric materials may be referred to herein as high k). Examples of high k dielectric materials include, for example, a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The first spacer portions 22a and the second spacer portions 22b can be formed by deposing a spacer material layer (not shown) over the first mandrel structures 18, the second mandrel structures 20 and exposed surfaces of the substrate 10 by a conformal deposition process, such as, for example, CVD, PECVD or atomic layer deposition (ALD). The spacer material layer that is formed may have a thickness from 5 nm to 15 nm, although lesser and greater thicknesses can also be employed. The thickness of the spacer material layer determines the width of each semiconductor fin eventually formed in the substrate 10.

Subsequently, horizontal portions of the spacer material layer are removed utilizing an anisotropic etch forming the first spacer portions 22a on the exposed sidewalls of the first mandrel structures 18 and the second spacer portions 22b on the exposed sidewalls of the second mandrel structures 20. The width of each first spacer portion 22a and each second spacer portions 22 b, as measured from its base, can be from 5 nm to 10 nm, although lesser and greater thicknesses can also be employed. In one embodiment and as shown in FIG. 4A, the spacing $S_2$ between the closest adjacent first spacer portions 22a is about the same as the width of each first mandrel structure 18. Thus the pitch of the closest adjacent first spacer portions 22a equals the sum of the width of each first spacer portion 22a and the spacing $S_2$ which equals to the width of each first mandrel structure 18. The pitch of the adjacent first spacer portion 22a and second spacer portion 22b is determined by the size of the middle second mandrel structure 20.

Figure 5A:
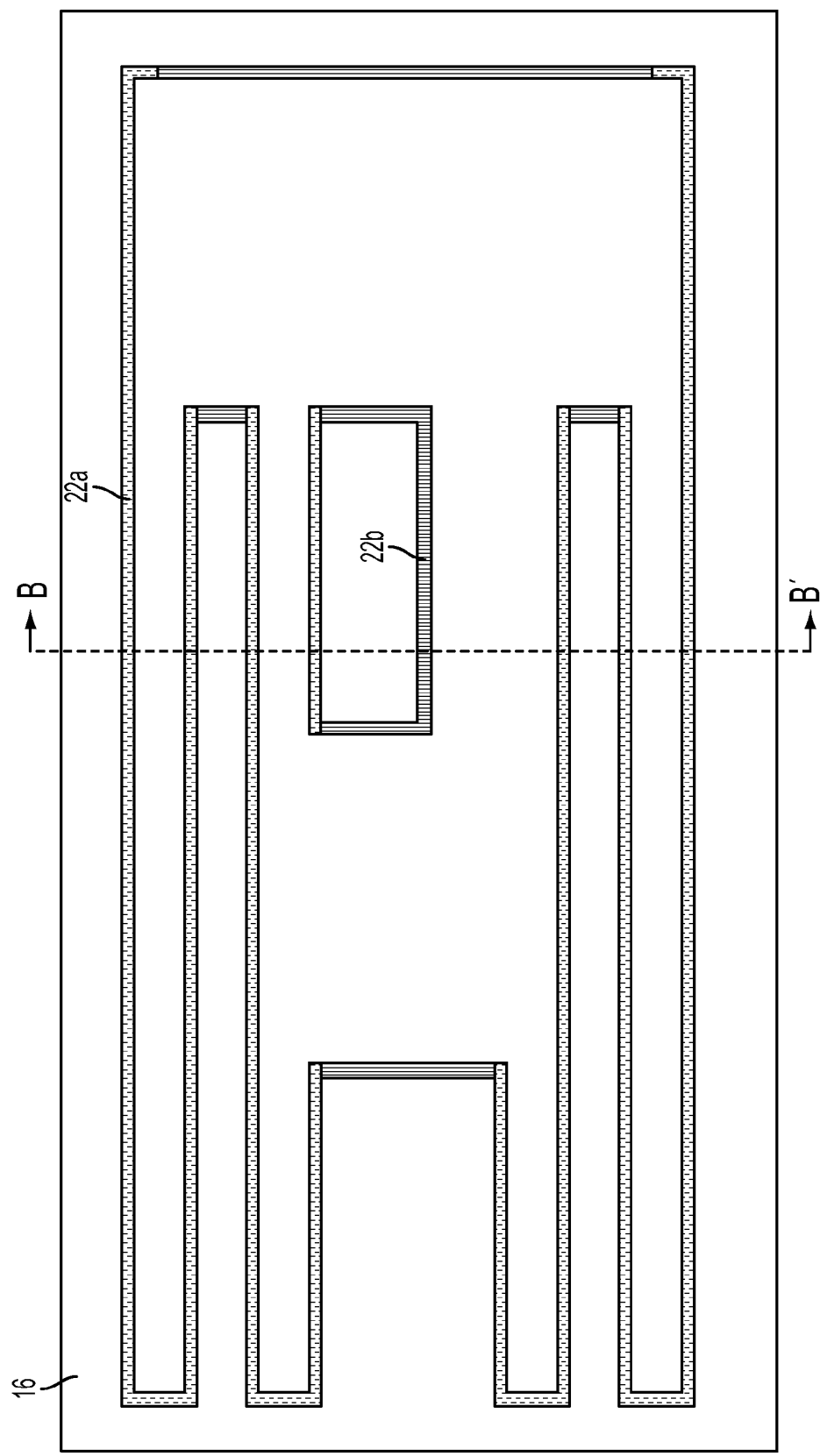
FIG. 5A is a top-down view of the exemplary semiconductor structure of FIG. 4A after removing the first mandrel structures and the second mandrel structures from the structure.
Figure 5B:
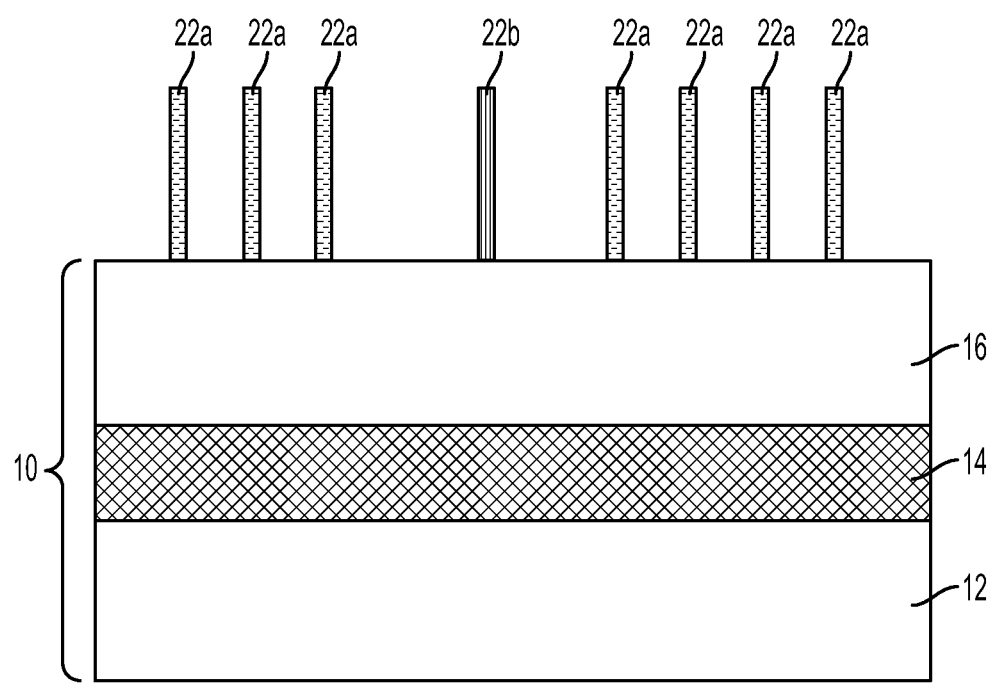
FIG. 5B is a cross-sectional view of the exemplary semiconductor structure of FIG. 5A along line B-B'.

Referring now to FIGS. 5A-5B, there is illustrated the exemplary semiconductor structure of FIGS. 4A-4B after removing the first mandrel structures 18 and the second mandrel structures 20 from the structure, leaving the first spacer portions 22a and the second spacer portions 22b on the surface of substrate 10. At least one etching process, either a wet etching or a dry etching can be performed to remove each first mandrel structure 18 and each second mandrel structure 20 selective to each first spacer portion 22a and each second spacer portion 22b. The at least one etching process can be an anisotropic or an isotropic etch. All portions of the top semiconductor layer 16 that are not covered by the first spacer portions 22a and the second spacer portions 22b are thus physically exposed.

Figure 6A:
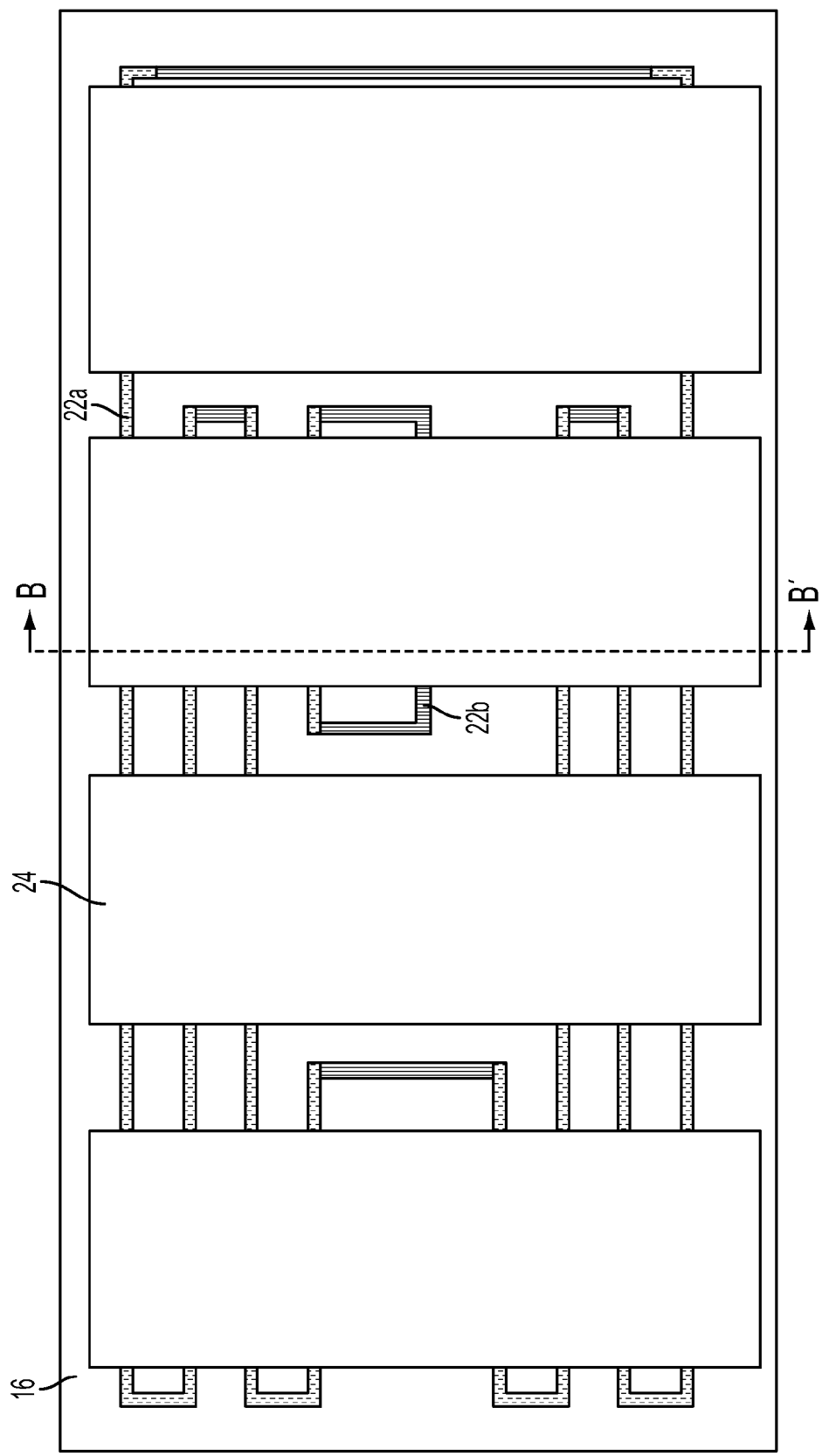
FIG. 6A is a top-down view of the exemplary semiconductor structure of FIG. 5A after forming a cut mask over unwanted portions of first spacer portions and second spacer portions.
Figure 6B:
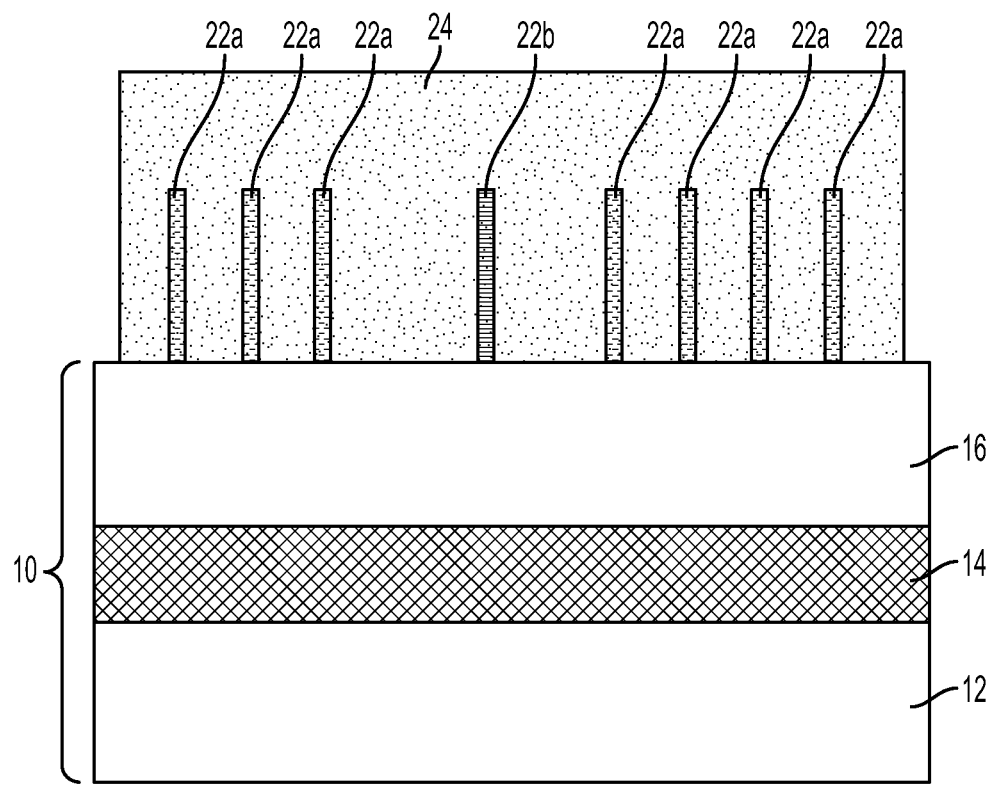
FIG. 6B is a cross-sectional view of the exemplary semiconductor structure of FIG. 6A along line B-B'.

Referring now to FIGS. 6A-6B, there is illustrated the exemplary semiconductor structure of FIGS. 5A-5B after forming a cut mask 24 over unwanted portions of the first spacer portions 22a and the second spacer portions 22b. In one embodiment, the first cut mask 24 can be a photoresist layer that is lithographically patterned to expose the unwanted portions of the first spacer portions 22a and the second spacer portions 22b.

Figure 7A:
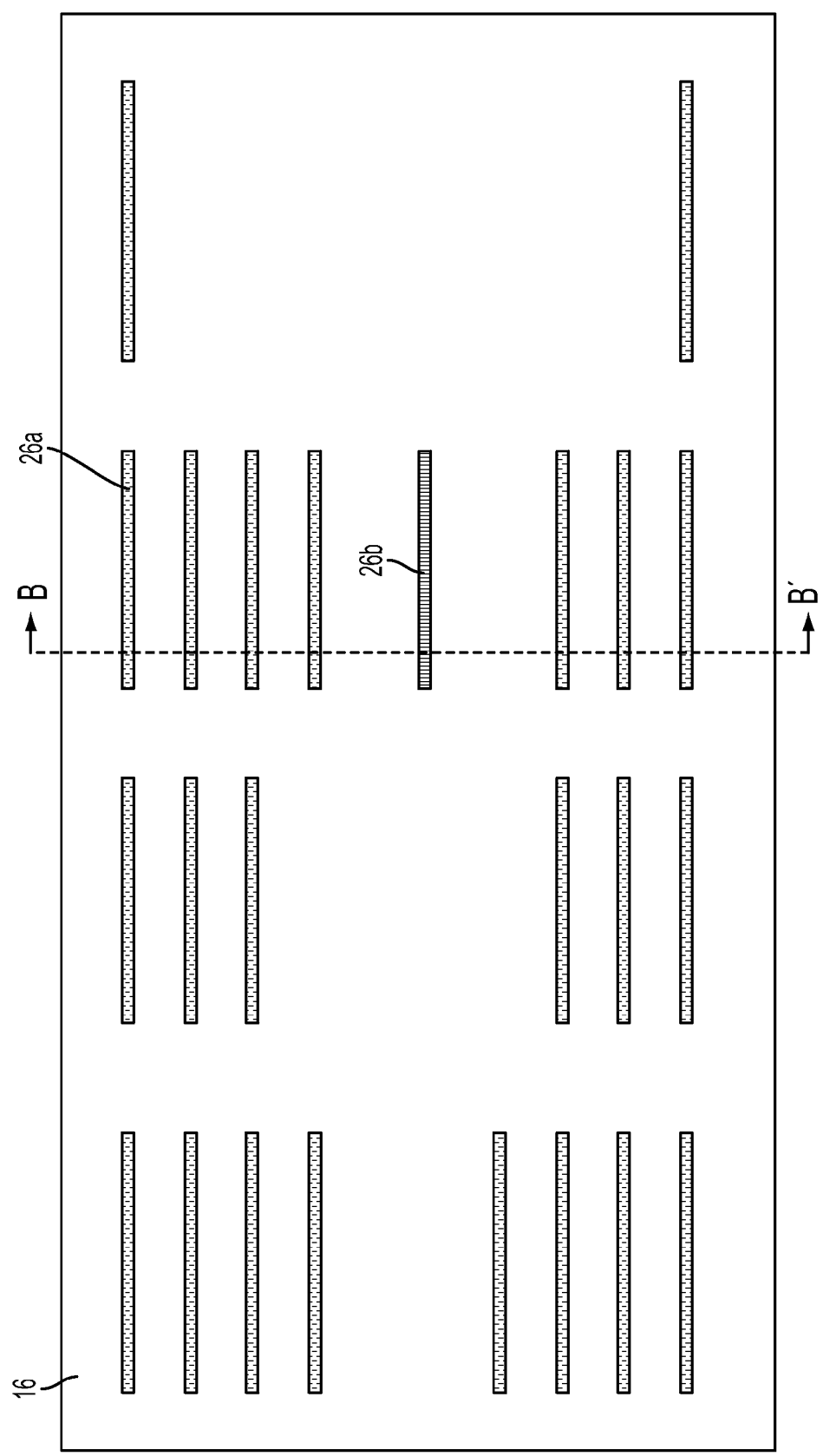
FIG. 7A is a top-down view of the exemplary semiconductor structure of FIG. 6A after cutting the unwanted portions of the first spacer portions and the second spacer portions that are not covered by the cut mask.
Figure 7B:
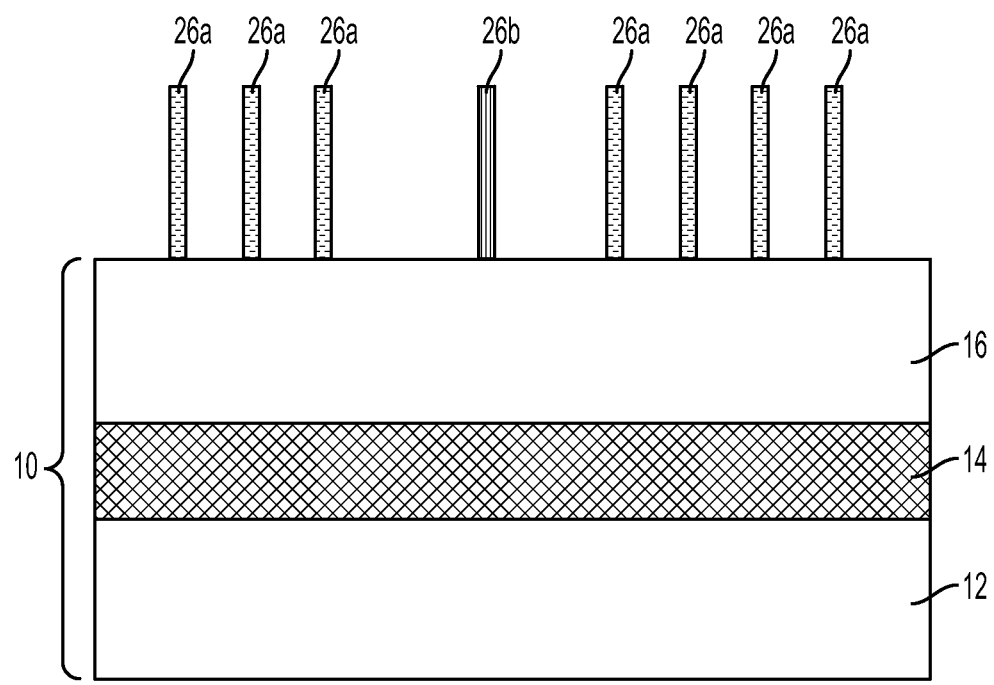
FIG. 7B is a cross-sectional view of the exemplary semiconductor structure of FIG. 7A along line B-B'.

Referring now to FIGS. 7A-7B, there is illustrated the exemplary semiconductor structure of FIGS. 6A-6B after cutting the unwanted portions of the first spacer portions 22a and the second spacer portions 22b that are not covered by the cut mask 24. The cutting of the first spacer portions 22a and second spacer portions 22b occurs along the widthwise direction. Physically exposed unwanted portions of the first spacer portions 22a and the second spacer portions 22b in the gaps of the cut mask 24 may be removed selective to the top semiconductor layer 16 by an anisotropic etch such as, for example, reactive ion etch (RIE). Remaining portions of the first spacer portions 22a are herein referred to as patterned first spacer portions 26a and a remaining portion of the second spacer portions 22b is herein referred to as patterned second spacer portion 26b.

Subsequently, the cut mask 24 is removed selective to the pattered first spacer portions 26a and patterned second spacer portions 26b. In one embodiment and when the cut mask 24 is a patterned photoresist layer, the cut mask 24 can be removed by ashing.

Figure 8A:
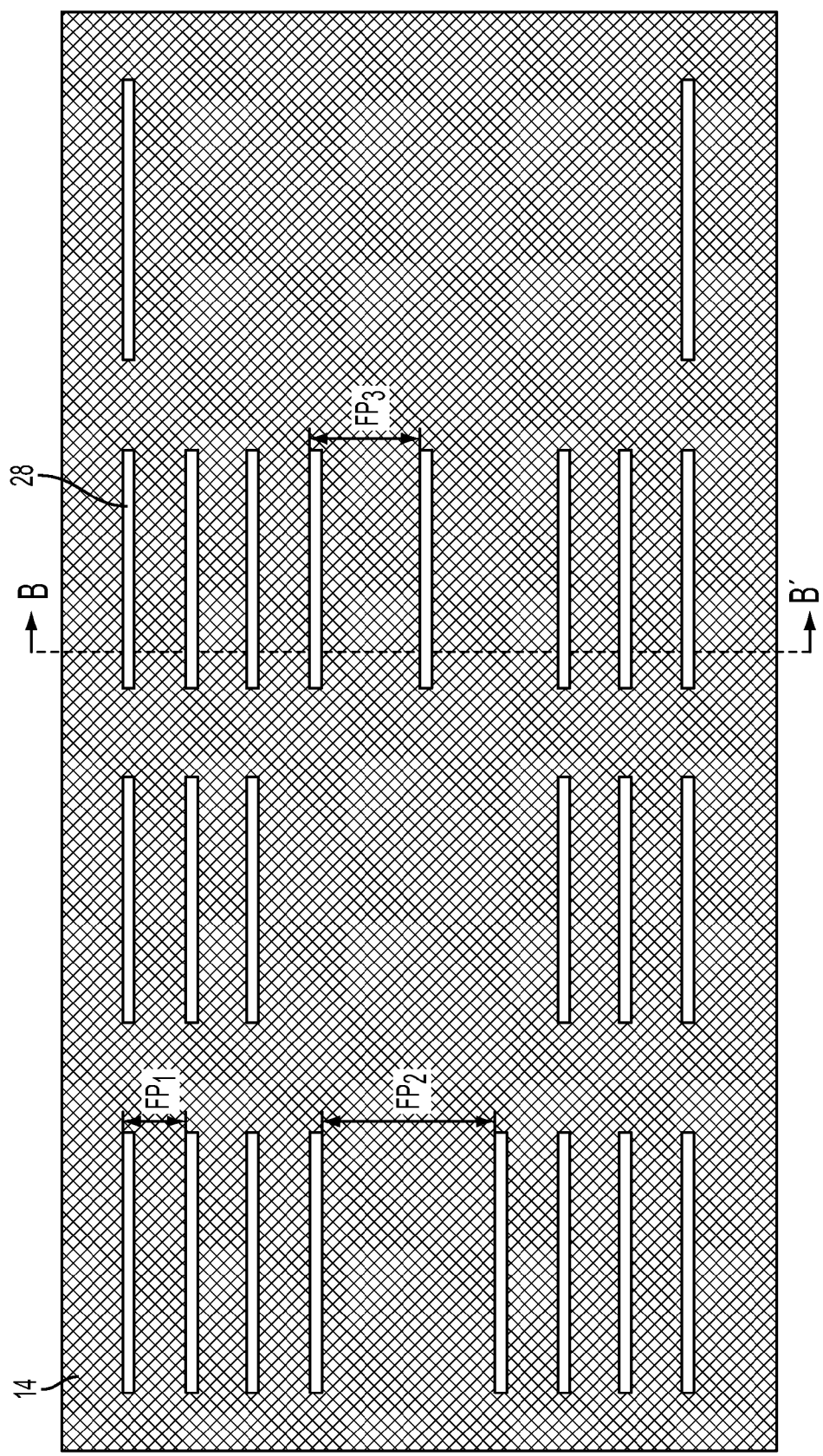
FIG. 8A is a top-down view of the exemplary semiconductor structure of FIG. 7A after forming a plurality of semiconductor fins.
Figure 8B:
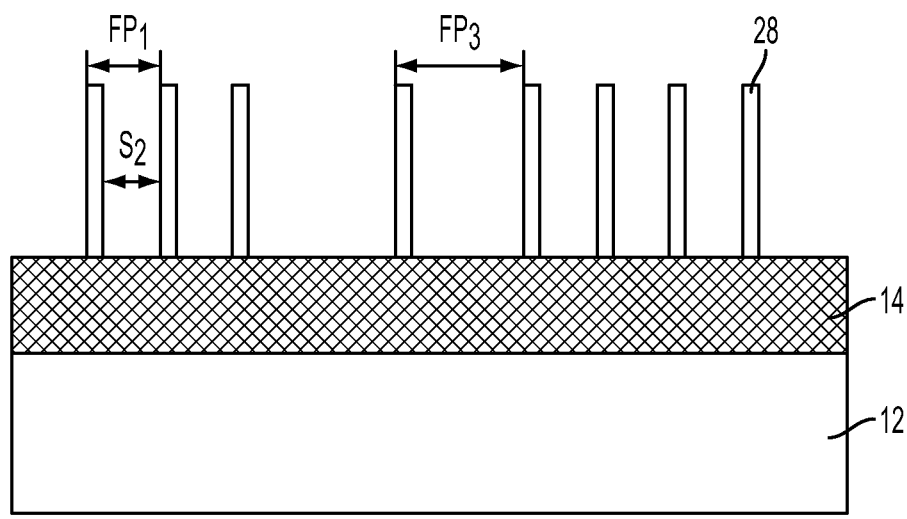
FIG. 8B is a cross-sectional view of the exemplary semiconductor structure of FIG. 8A along line B-B'.

Referring now to FIGS. 8A-8B, there is illustrated the exemplary semiconductor structure of FIGS. 7A-7B after forming a plurality of semiconductor fins 28. The semiconductor fins 28 can be formed by first patterning the substrate 10 using the patterned first spacer portions 26a and the patterned second spacer portion 26b as an etch mask. The patterning of the substrate 10 can be performed by utilizing an anisotropic etching process. In one embodiment of the present application, the patterning of the substrate 10 includes patterning of the topmost semiconductor layer 16 to provide a plurality of semiconductor fins 28 having a width that is the same as the width of each patterned spacer portion (26a, 26b).

Due to the varying spacing between pairs of patterned spacer portions (i.e., patterned first spacer portions 26a and patterned second spacer portion 26b), the semiconductor fins 28 are formed with variable fin-to-fin spacing (i.e., variable pitches). Specifically, the semiconductor fins 28 includes a first sub-set of semiconductor fins 28 having a first pitch equal to the sum of the width of each semiconductor fin 28 and the spacing $S_2$ between two closest adjacent semiconductor fins 28 and a second sub-set of semiconductor fins having a second pitch equal to n times the first pitch because both first sub-set and second sub-set of semiconductor fins 28 are formed by transferring a sub-set of patterned first spacer portions 26a derived from the first spacer portions 22a present on sidewalls of the first mandrel structures 18, wherein n is an integer greater than one. The semiconductor fins 28 further includes a third sub-set of semiconductor fins 28 having a third pitch which does not equal to an integer multiplication of the first pitch because the third sub-set of semiconductor fins 28 are formed by transferring a combination pattern of another sub-set of patterned first spacer portions 26a derived from the first spacer portions 22a present on sidewalls of first mandrel structures 18 and a patterned second spacer portion 26b derived from second spacer portions 22b present on sidewalls of second mandrel structures 20.

As used herein, a "semiconductor fin" refers to a semiconductor structure including a portion having a shape of a rectangular parallelepiped. The direction along which a semiconductor fin laterally extends the most is herein referred to as a "lengthwise direction" of the semiconductor fin. The height of each semiconductor fin 28 can be in a range from 5 nm to 300 nm, although lesser and greater heights can also be employed. The width of each semiconductor fin 28 can be in a range from 5 nm to 50 nm, although lesser and greater widths can also be employed. Multiple semiconductor fins 28 may be arranged such that each semiconductor fin has the same lengthwise direction, and is laterally spaced from each other along a horizontal direction that is perpendicular to the lengthwise direction. In this case, the horizontal direction that is perpendicular to the common lengthwise direction is referred to as a "widthwise direction." Each semiconductor fin 28 includes a pair of parallel sidewalls along the lengthwise direction and a pair of parallel sidewalls along the widthwise direction and at each end segment of the semiconductor fin 28.

Subsequently, the patterned first spacers 26a and the patterned second 26b) can be removed selective to the semiconductor fins 28 by an etch which can be an anisotropic or an isotropic etch. Alternatively, the patterned spacer 26 can also be removed by a chemical mechanical planarization (CMP)

process. The removal of the patterned first spacers 26a and the patterned second spacers 26b exposes topmost surfaces of the semiconductor fins 28.

At this point of the present application, a functional gate structure utilizing a gate first or a gate last process can be performed to provide FinFET structures. It is noted that while the above describes a method of forming semiconductor fins from a semiconductor substrate, the method of the present application can be applied to pattern any other type substrate.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming a set of first mandrel structures on a substrate;
    removing at least one first mandrel structure from the set of first mandrel structures;
    forming a set of second mandrel structures over remaining first mandrel structures and portions of the substrate, wherein each second mandrel structure overlaps at least a portion of at least one first mandrel structure of the remaining first mandrel structures and fills at least a portion of at least one space between adjacent first mandrel structures of the remaining first mandrel structures;
    forming first spacer portions on exposed sidewalls of the remaining first mandrel structures and second spacer portions on exposed sidewalls of the second mandrel structures;
    removing the remaining first mandrel structures and the second mandrel structures selective to the first spacer portions and second spacer portions; and
    transferring a pattern of the first spacer portions and the second spacer portions into a portion of the substrate.

2. The method of claim 1, wherein each second mandrel structure comprises a material different from a material of each first mandrel structure.

3. The method of claim 2, wherein each first mandrel structure comprises silicon and each second mandrel structure comprises silicon germanium.

4. The method of claim 3, further comprising removing portions of the first spacer portions and the second spacer portions prior to the transferring the pattern of the first spacer portions and the second spacer portions into the portion of the substrate.

5. The method of claim 4, wherein the removing the portions of the first spacer portions and the second spacer portions comprising:
    forming a cut mask over portions the first spacer portions and the second spacer portions; and
    removing exposed portions of the first spacer portions and the second spacer portions.

6. The method of claim 5, further comprising removing the cut mask selective to remaining portions of the first spacer portions and the second spacer portions.

7. The method of claim 6, further comprising removing the remaining portions of the first spacer portions and the second spacer portions after the transferring the pattern of the spacers into the portion of the substrate.

8. The method of claim 1, wherein the first mandrel structures are spaced apart from one another along a widthwise direction perpendicular to a lengthwise direction of each first mandrel structure.

9. The method of claim 1, wherein the portion of the substrate comprises a semiconductor material.

10. The method of claim 1, wherein the forming the set of first mandrel structures comprises:
    depositing a first mandrel material layer on an entire topmost surface of the substrate; and
    patterning the first mandrel material layer by lithography and etching.

11. The method of claim 10, wherein the topmost surface of the substrate is a semiconductor material surface.

12. The method of claim 10, wherein the topmost surface of the substrate is a dielectric material surface provided by a pad layer comprised of silicon nitride or a bilayer of silicon nitride and silicon oxide.

13. The method of claim 1, wherein the forming the set of second mandrel structures comprises:
    depositing a second mandrel material layer over the remaining first mandrel structures and exposed surfaces of the substrate; and
    patterning the second mandrel layer by lithography and etching.

14. The method of claim 1, wherein a spacing between a first spacer portion and an adjacent second spacer portion is determined by a width of a second mandrel structure on which the second spacer portion is formed.

15. The method of claim 1, wherein the forming the first spacer portions on the exposed sidewalls of the remaining first mandrel structures and the second spacer portions on the exposed sidewalls of the second mandrel structures comprises:
    forming a conformal spacer material layer over the first mandrel structures, the second mandrel structure and exposed surfaces of the substrate; and
    removing horizontal portions of the spacer material layer by an anisotropic etch.

16. The method of claim 15, wherein the forming the conformal spacer material layer is performed by chemical vapor deposition (CVD), plasma enhanced chemical vapor deposition (PECVD), or atomic layer deposition (ALD).

17. The method of claim 1, wherein the removing the at least one first mandrel structure from the set of first mandrel structures is performed by an anisotropic etch.

* * * * *